(12) United States Patent
Chen et al.

(10) Patent No.: US 10,074,309 B2
(45) Date of Patent: Sep. 11, 2018

(54) AMOLED PIXEL DRIVING CIRCUIT AND AMOLED PIXEL DRIVING METHOD

(71) Applicant: Shenzhen China Star Optoelectronics Technology Co., Ltd., Shenzhen (CN)

(72) Inventors: Xiaolong Chen, Shenzhen (CN); Yichien Wen, Shenzhen (CN); Mingjong Jou, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 19 days.

(21) Appl. No.: 15/514,528

(22) PCT Filed: Mar. 15, 2017

(86) PCT No.: PCT/CN2017/076767
§ 371 (c)(1),
(2) Date: Mar. 26, 2017

(65) Prior Publication Data

US 2018/0233080 A1 Aug. 16, 2018

(51) Int. Cl.
*G09G 3/3233* (2016.01)
*G09G 3/3258* (2016.01)
*H01L 27/12* (2006.01)
*H01L 51/52* (2006.01)

(52) U.S. Cl.
CPC ......... *G09G 3/3233* (2013.01); *G09G 3/3258* (2013.01); *H01L 27/1214* (2013.01); *H01L 51/5206* (2013.01); *H01L 51/5221* (2013.01); *G09G 2300/0819* (2013.01); *G09G 2310/0264* (2013.01); *G09G 2320/0233* (2013.01); *G09G 2320/045* (2013.01)

(58) Field of Classification Search
CPC ....... G09G 3/3233–3/3258; G09G 2300/0439; G09G 2300/0809–2300/0871; G09G 2320/0233
USPC ..................................... 345/76–83
See application file for complete search history.

(56) References Cited

U.S. PATENT DOCUMENTS 9,734,761 B2* 8/2017 Kim .................. G09G 3/3258
2011/0090202 A1* 4/2011 Han ..................... G09G 3/32
345/211
2014/0118328 A1 5/2014 Guo et al.
(Continued)

FOREIGN PATENT DOCUMENTS

CN 1964585 A 5/2007
CN 102708789 A 10/2012
(Continued)

*Primary Examiner* — Michael Pervan
(74) *Attorney, Agent, or Firm* — Leong C. Lei

(57) ABSTRACT

The present invention provides an AMOLED pixel driving circuit and an AMOLED pixel driving method. The AMOLED pixel driving circuit utilizes the 6T1C structure pixel driving circuit with a specific drive timing and can effectively compensate the threshold voltage of the drive thin film transistor and can stabilize the current flowing through the organic light emitting diode to ensure the uniform brightness of the organic light emitting diode and improve the display effect of the pictures. The organic light emitting diode can emit light only in the light emitting stage to avoid the unnecessary irradiance of the organic light emitting diode to reduce the electrical power consumption.

11 Claims, 4 Drawing Sheets

(56) References Cited

U.S. PATENT DOCUMENTS

| | | | |
|---|---|---|---|
| 2016/0284273 A1* | 9/2016 | Ma | G09G 3/3258 |
| 2016/0343300 A1* | 11/2016 | Wang | G09G 3/3233 |
| 2016/0351123 A1* | 12/2016 | Qing | G09G 3/3275 |
| 2016/0372049 A1* | 12/2016 | Wang | G09G 3/3225 |
| 2017/0025062 A1* | 1/2017 | Wang | G09G 3/3233 |
| 2017/0069264 A1* | 3/2017 | Dai | G09G 3/3233 |
| 2017/0103701 A1* | 4/2017 | Zhu | G09G 3/3233 |
| 2017/0236469 A1* | 8/2017 | Wang | G09G 3/3233 345/212 |
| 2017/0278458 A1* | 9/2017 | Wang | G09G 3/3258 |
| 2018/0082636 A1* | 3/2018 | Cai | G09G 3/3258 |

FOREIGN PATENT DOCUMENTS

| | | |
|---|---|---|
| CN | 104464641 A | 3/2015 |
| CN | 104700778 A | 6/2015 |
| CN | 205004016 U | 1/2016 |

\* cited by examiner

| providing an AMOLED pixel driving circuit; the AMOLED pixel driving circuit comprising: a first thin film transistor (T1), a second thin film transistor (T2), a third thin film transistor (T3), a fourth thin film transistor (T4), a fifth thin film transistor (T5), a sixth thin film transistor (T6), a capacitor (C1) and an organic light emitting diode (D); a gate of the first thin film transistor (T1) is electrically coupled to a first node (G), and a source receives a power supply high voltage (OVDD), and a drain is electrically coupled to a source of the fourth thin film transistor (T4), and a gate of the second thin film transistor (T2) receives a first scan control signal (Scan1), and a source is electrically coupled to the first node (G), and a drain is electrically coupled to the source of the fourth thin film transistor (T4), and a gate of the third thin film transistor (T3) receives a second scan control signal (Scan2), and a source is electrically coupled to a second node (N), and a drain is electrically coupled to the first node (G), and a gate of the fourth thin film transistor (T4) receives a third scan control signal (Scan3), and a source is electrically coupled to a drain of the second thin film transistor (T2) and a drain of the first thin film transistor (T1), and a drain is electrically coupled to an anode of the organic light emitting diode (D), and a gate of the fifth thin film transistor (T5) receives the third scan control signal (Scan3), and a source is electrically coupled to the second node (N) and a drain receives an initialization voltage (Vini), and a gate of the sixth thin film transistor (T6) receives the third scan control signal (Scan3), and a source receives a data signal (Data), and a drain is electrically coupled to the second node (N), and one end of the capacitor (C1) is electrically coupled to the first node (G), and the other end is electrically coupled to the second node (N), and a cathode of the organic light emitting diode (D) receives a power supply low voltage (OVSS); the sixth thin film transistor (T6) is a N type thin film transistor, and the first thin film transistor (T1), the second thin film transistor (T2), the third thin film transistor (T3), the fourth thin film transistor (T4) and the fifth thin film transistor (T5) are P type thin film transistors; | S1 |

↓

| entering an initialization stage (1); the third scan control signal (Scan3) provides a high voltage level, and the sixth thin film transistor (T6) is on, and the fourth thin film transistor (T4) and the fifth thin film transistor (T5) are off, and the second scan control signal (Scan2) provides a low voltage level, and the third thin film transistor (T3) is on, and the first scan control signal (Scan1) provides a high voltage level, and the second thin film transistor (T2 is off, and the data signal (Data) charges the first node (G) and the second node (N) to make voltages of the first node (G) and the second node (N) equal to a voltage of the data signal (Data), and the organic light emitting diode (D) does not emit light; | S2 |

↓

| entering a voltage level storage stage (2); the third scan control signal (Scan3) provides a high voltage level, and the sixth thin film transistor (T6) is on, and the fourth thin film transistor (T4) and the fifth thin film transistor (T5) are off, and the second scan control signal (Scan2) provides a high voltage level, and the third thin film transistor (T3) is off, and the first scan control signal (Scan1) provides a low voltage level, and the second thin film transistor (T2) is on, and the voltage of the second node (N) is still equal to the voltage of the data signal (Data), and the power supply high voltage (OVDD) constantly charges the first node (G) until Vg=Vs-Vth, wherein Vs is a source voltage of the first thin film transistor (T1), and Vg is the voltage of the first node (G), and Vth is a threshold voltage of the first thin film transistor (T1); | S3 |

↓

| entering a light emitting stage (3); the third scan control signal (Scan3) provides a low voltage level, and the sixth thin film transistor (T6) is off, and the fourth thin film transistor (T4) and the fifth thin film transistor (T5) are on, and the second scan control signal (Scan2) provides a high voltage level, and the third thin film transistor (T3) is off, and the first scan control signal (Scan1) provides a low voltage level, and the second thin film transistor (T2) is off, and the voltage of the second node (N) is changed to be the initialization voltage (Vini), and the voltage of the first node (G) is change to be Vs-Vth+Vini-Vdata, wherein Vdata is the voltage of the data signal (Data), and a voltage between the source of the first thin film transistor (T1) and the first node (G), i.e. a source-gate voltage difference of the first thin film transistor (T1) is changed to be Vdata-Vini+Vth, and the organic light emitting diode (D) emits light, and the current flowing through the organic light emitting diode (D) is irrelevant with the threshold voltage of the first thin film transistor (T1). | S4 |

Fig. 4

AMOLED PIXEL DRIVING CIRCUIT AND AMOLED PIXEL DRIVING METHOD

FIELD OF THE INVENTION

The present invention relates to a display technology field, and more particularly to an AMOLED pixel driving circuit and an AMOLED pixel driving method.

BACKGROUND OF THE INVENTION

The Organic Light Emitting Display (OLED) possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types according to the driving methods, which are the Passive Matrix OLED (PMOLED) and the Active Matrix OLED (AMOLED), i.e. two types of the direct addressing and the Thin Film Transistor (TFT) matrix addressing. The AMOLED comprises pixels arranged in array and belongs to active display type, which has high lighting efficiency and is generally utilized for the large scale display devices of high resolution.

The AMOLED is a current driving element. When the electrical current flows through the organic light emitting diode, the organic light emitting diode emits light, and the brightness is determined according to the current flowing through the organic light emitting diode itself. Most of the present Integrated Circuits (IC) only transmit voltage signals. Therefore, the AMOLED pixel driving circuit needs to accomplish the task of converting the voltage signals into the current signals. The traditional AMOLED pixel driving circuit generally is 2T1C, which is a structure comprising two thin film transistors and one capacitor to convert the voltage into the current.

As shown in FIG. 1, which is a 2T1C pixel driving circuit employed for an AMOLED, comprising a first P type thin film transistor T10, a second P type thin film transistor T20 and a capacitor C. The first P type thin film transistor T10 is a switch thin film transistor, and the second P type thin film transistor T20 is a drive thin film transistor, and the capacitor C is a storage capacitor. Specifically, a gate of the first P type thin film transistor T10 receives a scan signal Scan, and a source receives a data signal Data, and a drain is electrically coupled to a gate of the second P type thin film transistor T20 and one end of the capacitor C; a source of the second P type thin film transistor T20 receives a power supply voltage VDD, and a drain is electrically coupled to an anode of the organic light emitting diode D; a cathode of the organic light emitting diode D is grounded; one end of the capacitor C is electrically coupled to the drain of the first P type thin film transistor T10, and the other end is electrically coupled to the source of the second P type thin film transistor T20. As the AMOLED displays, the scan signal Scan controls the first P type thin film transistor T10 to be on, and the data signal Data enters the gate of the second P type thin film transistor T20 and the capacitor C via the first P type thin film transistor T10. Then, the first P type thin film transistor T10 is off. With the storage function of the capacitor C, the gate voltage of the second P type thin film transistor T20 can remain to hold the data signal voltage to make the second P type thin film transistor T20 be in the conducted state to drive the current to enter the organic light emitting diode D via the second P type thin film transistor T20 and to drive the organic light emitting diode D to emit light.

The aforesaid 2T1C pixel driving circuit employed for AMOLED according to prior art is highly sensitive to the threshold voltage drift of the drive thin film transistor. Along with the threshold voltage drift of the drive thin film transistor, the change of the current flowing through the organic light emitting diode is very large. Thus, the current flowing through the organic light emitting diode is unstable and the brightness of the organic light emitting diode is very nonuniform, which extremely affect the display effect of the pictures. For solving the aforesaid issue, it is necessary to add a compensation circuit to each of the pixels. The compensation means that the compensation has to be implemented to the threshold voltage of the drive thin film transistor in each pixel to make the current flowing through the organic light emitting diode irrelevant with the threshold voltage.

SUMMARY OF THE INVENTION

An objective of the present invention is to provide an AMOLED pixel driving circuit, which can effectively compensate the threshold voltage of the drive thin film transistor and stabilize the current flowing through the organic light emitting diode to ensure the uniform brightness of the organic light emitting diode and improve the display effect of the pictures.

Another objective of the present invention is to provide an AMOLED pixel driving method, which can effectively compensate the threshold voltage of the drive thin film transistor and solve the issue of the unstable current flowing through the organic light emitting diode caused by the threshold voltage drift to achieve the uniform brightness of the organic light emitting diode and improve the display effect of the pictures.

For realizing the aforesaid objectives, the present invention provides an AMOLED pixel driving circuit, comprising: a first thin film transistor, a second thin film transistor, a third thin film transistor, a fourth thin film transistor, a fifth thin film transistor, a sixth thin film transistor, a capacitor and an organic light emitting diode;

a gate of the first thin film transistor being electrically coupled to a first node, and a source receiving a power supply high voltage, and a drain being electrically coupled to a source of the fourth thin film transistor;

a gate of the second thin film transistor receiving a first scan control signal, and a source being electrically coupled to the first node, and a drain being electrically coupled to the source of the fourth thin film transistor;

a gate of the third thin film transistor receiving a second scan control signal, and a source being electrically coupled to a second node, and a drain being electrically coupled to the first node;

a gate of the fourth thin film transistor receiving a third scan control signal, and a source being electrically coupled to a drain of the second thin film transistor and a drain of the first thin film transistor, and a drain being electrically coupled to an anode of the organic light emitting diode;

a gate of the fifth thin film transistor receiving the third scan control signal, and a source being electrically coupled to the second node and a drain receiving an initialization voltage;

a gate of the sixth thin film transistor receiving the third scan control signal, and a source receiving a data signal, and a drain being electrically coupled to the second node;

one end of the capacitor being electrically coupled to the first node, and the other end being electrically coupled to the second node;

a cathode of the organic light emitting diode receiving a power supply low voltage;

the sixth thin film transistor being a N type thin film transistor, and the first thin film transistor, the second thin film transistor, the third thin film transistor, the fourth thin film transistor and the fifth thin film transistor being P type thin film transistors.

The first scan control signal, the second scan control signal and the third scan control signal are combined with one another, and correspond to an initialization stage, a voltage level storage stage, a light emitting stage one after another, and control the organic light emitting diode not to emit light in the initialization stage and the voltage level storage stage.

in the initialization stage, the third scan control signal provides a high voltage level, and the second scan control signal provides a low voltage level, and the first scan control signal provides a high voltage level;

in the voltage level storage stage, the third scan control signal provides a high voltage level, and the second scan control signal provides a high voltage level, and the first scan control signal provides a low voltage level;

in the light emitting stage, the third scan control signal provides a low voltage level, and the second scan control signal provides a high voltage level, and the first scan control signal provides a high voltage level.

All of the first scan control signal, the second scan control signal and the third scan control signal are provided by an external sequence controller.

All of the first thin film transistor, the second thin film transistor, the third thin film transistor, the fourth thin film transistor, the fifth thin film transistor and the sixth thin film transistor are Low Temperature Poly-silicon thin film transistors, oxide semiconductor thin film transistors or amorphous silicon thin film transistors.

The present invention further provides an AMOLED pixel driving method, comprising steps of:

step S1, providing an AMOLED pixel driving circuit;

the AMOLED pixel driving circuit comprising: a first thin film transistor, a second thin film transistor, a third thin film transistor, a fourth thin film transistor, a fifth thin film transistor, a sixth thin film transistor, a capacitor and an organic light emitting diode;

a gate of the first thin film transistor being electrically coupled to a first node, and a source receiving a power supply high voltage, and a drain being electrically coupled to a source of the fourth thin film transistor;

a gate of the second thin film transistor receiving a first scan control signal, and a source being electrically coupled to the first node, and a drain being electrically coupled to the source of the fourth thin film transistor;

a gate of the third thin film transistor receiving a second scan control signal, and a source being electrically coupled to a second node, and a drain being electrically coupled to the first node;

a gate of the fourth thin film transistor receiving a third scan control signal, and a source being electrically coupled to a drain of the second thin film transistor and a drain of the first thin film transistor, and a drain being electrically coupled to an anode of the organic light emitting diode;

a gate of the fifth thin film transistor receiving the third scan control signal, and a source being electrically coupled to the second node and a drain receiving an initialization voltage;

a gate of the sixth thin film transistor receiving the third scan control signal, and a source receiving a data signal, and a drain being electrically coupled to the second node;

one end of the capacitor being electrically coupled to the first node, and the other end being electrically coupled to the second node;

a cathode of the organic light emitting diode receiving a power supply low voltage;

wherein the sixth thin film transistor is a N type thin film transistor, and the first thin film transistor, the second thin film transistor, the third thin film transistor, the fourth thin film transistor and the fifth thin film transistor are P type thin film transistors;

step S2, entering an initialization stage;

the third scan control signal provides a high voltage level, and the sixth thin film transistor is on, and the fourth thin film transistor and the fifth thin film transistor are off, and the second scan control signal provides a low voltage level, and the third thin film transistor is on, and the first scan control signal provides a high voltage level, and the second thin film transistor is off, and the data signal charges the first node and the second node to make voltages of the first node and the second node equal to a voltage of the data signal, and the organic light emitting diode does not emit light;

step S3, entering a voltage level storage stage;

the third scan control signal provides a high voltage level, and the sixth thin film transistor is on, and the fourth thin film transistor and the fifth thin film transistor are off, and the second scan control signal provides a high voltage level, and the third thin film transistor is off, and the first scan control signal provides a low voltage level, and the second thin film transistor is on, and the voltage of the second node is still equal to a voltage of the data signal, and the power supply high voltage constantly charges the first node until $V_g=V_s-V_{th}$, wherein $V_s$ is a source voltage of the first thin film transistor, and $V_g$ is the voltage of the first node, and $V_{th}$ is a threshold voltage of the first thin film transistor;

step S4, entering a light emitting stage;

the third scan control signal provides a low voltage level, and the sixth thin film transistor is off, and the fourth thin film transistor and the fifth thin film transistor are on, and the second scan control signal provides a high voltage level, and the third thin film transistor is off, and the first scan control signal provides a low voltage level, and the second thin film transistor is off, and the voltage of the second node is changed to be the initialization voltage, and the voltage of the first node is change to be $V_s-V_{th}+V_{ini}-V_{data}$, wherein $V_{data}$ is the voltage of the data signal, and the organic light emitting diode emits light, and a current flowing through the organic light emitting diode is irrelevant with the threshold voltage of the first thin film transistor.

All of the first scan control signal, the second scan control signal and the third scan control signal are provided by an external sequence controller.

All of the first thin film transistor, the second thin film transistor, the third thin film transistor, the fourth thin film transistor, the fifth thin film transistor and the sixth thin film transistor are Low Temperature Poly-silicon thin film transistors, oxide semiconductor thin film transistors or amorphous silicon thin film transistors.

The present invention further provides an AMOLED pixel driving circuit comprises: a first thin film transistor, a second thin film transistor, a third thin film transistor, a fourth thin film transistor, a fifth thin film transistor, a sixth thin film transistor, a capacitor and an organic light emitting diode;

a gate of the first thin film transistor being electrically coupled to a first node, and a source receiving a power supply high voltage, and a drain being electrically coupled to a source of the fourth thin film transistor;

a gate of the second thin film transistor receiving a first scan control signal, and a source being electrically coupled to the first node, and a drain being electrically coupled to the source of the fourth thin film transistor;

a gate of the third thin film transistor receiving a second scan control signal, and a source being electrically coupled to a second node, and a drain being electrically coupled to the first node;

a gate of the fourth thin film transistor receiving a third scan control signal, and a source being electrically coupled to a drain of the second thin film transistor and a drain of the first thin film transistor, and a drain being electrically coupled to an anode of the organic light emitting diode;

a gate of the fifth thin film transistor receiving the third scan control signal, and a source being electrically coupled to the second node and a drain receiving an initialization voltage;

a gate of the sixth thin film transistor receiving the third scan control signal, and a source receiving a data signal, and a drain being electrically coupled to the second node;

one end of the capacitor being electrically coupled to the first node, and the other end being electrically coupled to the second node;

a cathode of the organic light emitting diode receiving a power supply low voltage;

wherein the sixth thin film transistor is a N type thin film transistor, and the first thin film transistor, the second thin film transistor, the third thin film transistor, the fourth thin film transistor and the fifth thin film transistor are P type thin film transistors;

wherein the first scan control signal, the second scan control signal and the third scan control signal are combined with one another, and correspond to an initialization stage, a voltage level storage stage, a light emitting stage one after another, and control the organic light emitting diode not to emit light in the initialization stage and the voltage level storage stage.

wherein all of the first scan control signal, the second scan control signal and the third scan control signal are provided by an external sequence controller.

The benefits of the present invention are: the present invention provides an AMOLED pixel driving circuit, which utilizes the 6T1C structure pixel driving circuit with a specific drive timing and can effectively compensate the threshold voltage of the drive thin film transistor and can stabilize the current flowing through the organic light emitting diode to ensure the uniform brightness of the organic light emitting diode and improve the display effect of the pictures. The organic light emitting diode can emit light only in the light emitting stage to avoid the unnecessary irradiance of the organic light emitting diode to reduce the electrical power consumption. The present invention further provides an AMOLED pixel driving circuit, which can effectively compensate the threshold voltage of the drive thin film transistor and solve the issue of the unstable current flowing through the organic light emitting diode caused by the threshold voltage drift to achieve the uniform brightness of the organic light emitting diode and improve the display effect of the pictures.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings,

FIG. 4 is a flowchart of an AMOLED pixel driving method according to present invention.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
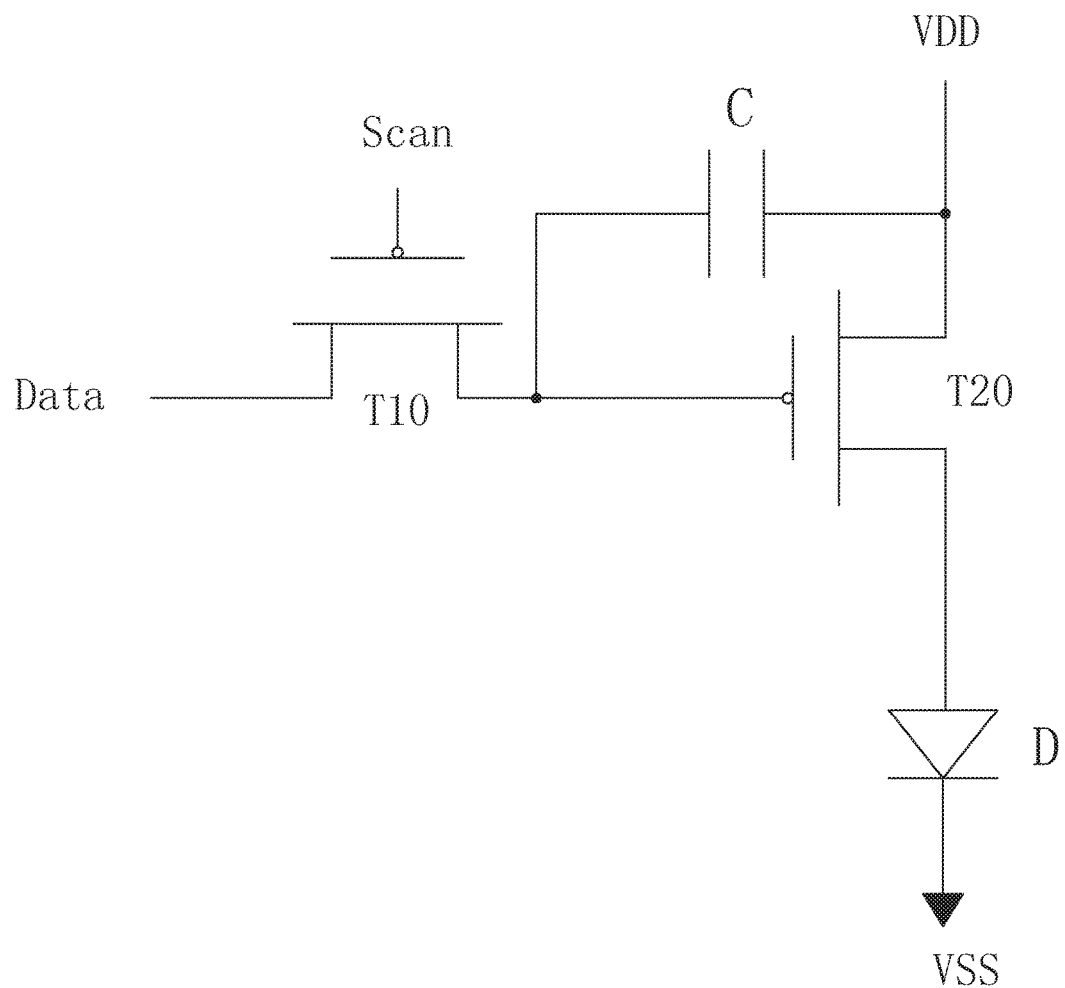
FIG. 1 is a circuit diagram of an AMOLED pixel driving circuit of a 2T1C structure according to prior art.
Figure 2:
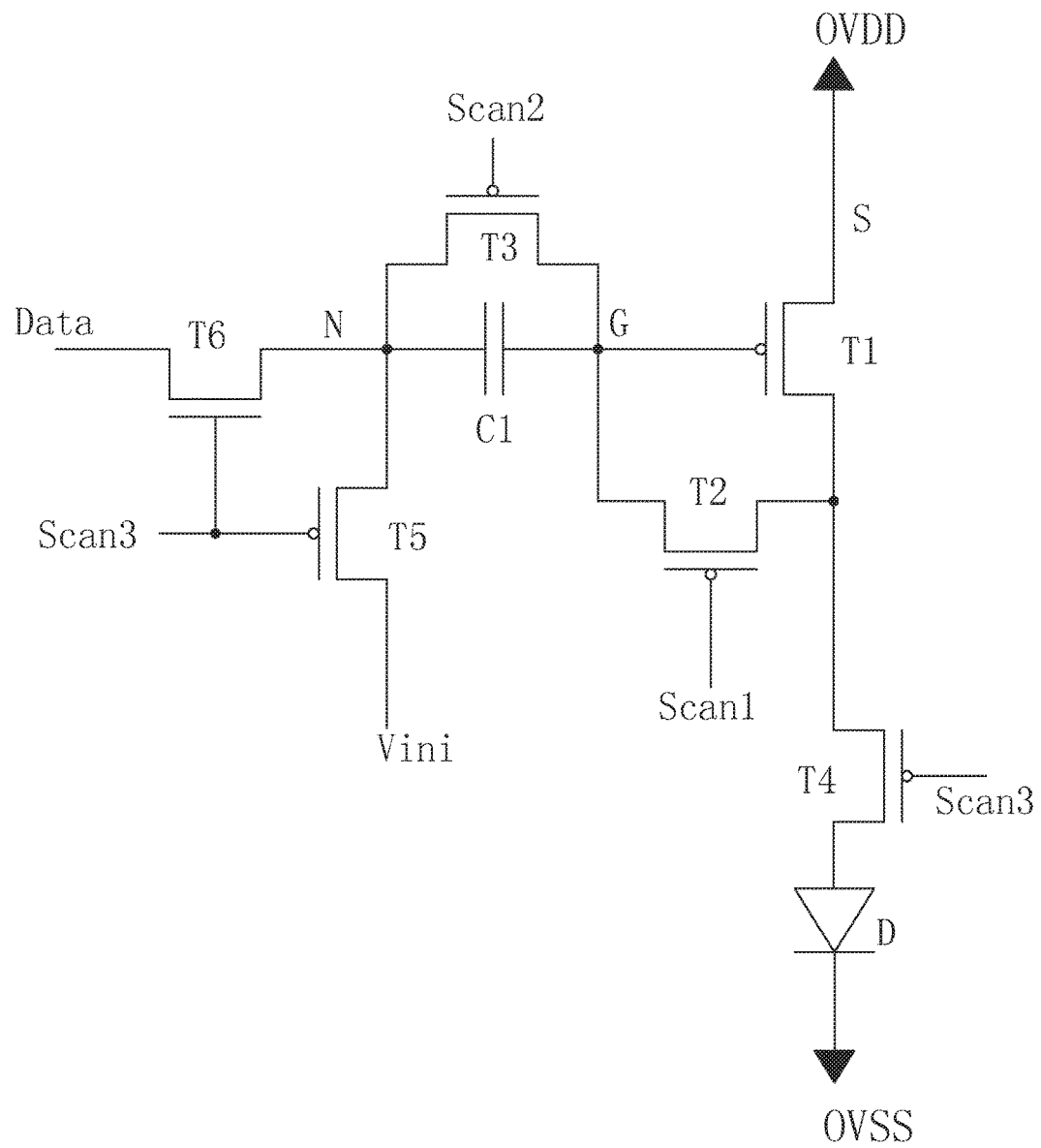
FIG. 2 is a circuit diagram of an AMOLED pixel driving circuit according to present invention.

Please refer to FIG. 2. The present invention provides an AMOLED pixel driving circuit, comprising: a first thin film transistor T1, a second thin film transistor T2, a third thin film transistor T3, a fourth thin film transistor T4, a fifth thin film transistor T5, a sixth thin film transistor T6, a capacitor C1 and an organic light emitting diode D;

The specific connection of the respective elements is: a gate of the first thin film transistor T1 is electrically coupled to a first node G, and a source receives a power supply high voltage OVDD, and a drain is electrically coupled to a source of the fourth thin film transistor T4, and a gate of the second thin film transistor T2 receives a first scan control signal Scan1, and a source is electrically coupled to the first node G, and a drain is electrically coupled to the source of the fourth thin film transistor T4, and a gate of the third thin film transistor T3 receives a second scan control signal Scan2, and a source is electrically coupled to a second node N, and a drain is electrically coupled to the first node G, and a gate of the fourth thin film transistor T4 receives a third scan control signal Scan3, and a source is electrically coupled to a drain of the second thin film transistor T2 and a drain of the first thin film transistor T1, and a drain is electrically coupled to an anode of the organic light emitting diode D, and a gate of the fifth thin film transistor T5 receives the third scan control signal Scan3, and a source is electrically coupled to the second node N and a drain receives an initialization voltage $V_{ini}$, and a gate of the sixth thin film transistor T6 receives the third scan control signal Scan3, and a source receives a data signal Data, and a drain is electrically coupled to the second node N, and one end of the capacitor C1 is electrically coupled to the first node G, and the other end is electrically coupled to the second node N, and a cathode of the organic light emitting diode D receives a power supply low voltage OVSS.

Specifically, the sixth thin film transistor T6 is a N type thin film transistor, and the first thin film transistor T1, the second thin film transistor T2, the third thin film transistor T3, the fourth thin film transistor T4 and the fifth thin film transistor T5 are P type thin film transistors.

Specifically, the first thin film transistor T1 is a drive thin film transistor, which is used for driving the organic light emitting diode D to emit light, and the AMOLED pixel driving circuit can compensate the threshold voltage of the drive thin film transistor, i.e the first thin film transistor T1. Specifically, all of the first thin film transistor T1, the second thin film transistor T2, the third thin film transistor T3, the fourth thin film transistor T4, the fifth thin film transistor T5 and the sixth thin film transistor T6 are Low Temperature Poly-silicon thin film transistors, oxide semiconductor thin film transistors or amorphous silicon thin film transistors. All of the first scan control signal Scan1, the second scan control signal Scan2 and the third scan control signal Scan3 are provided by an external sequence controller.

Figure 3:
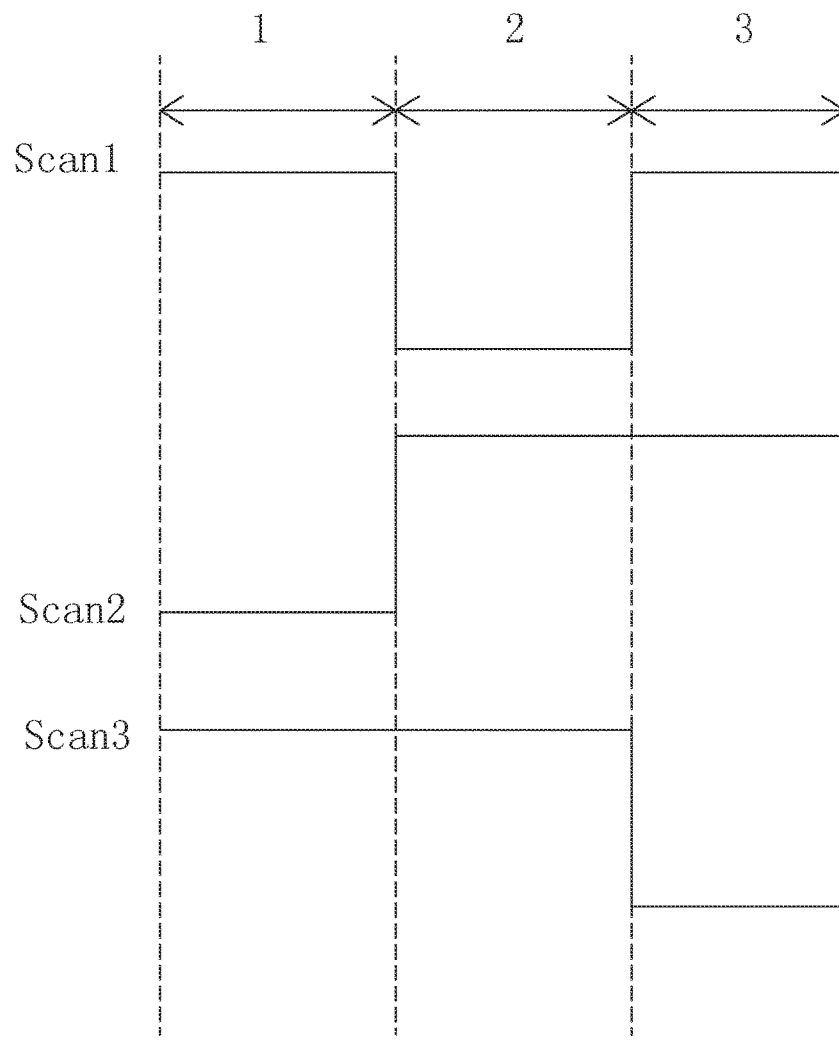
FIG. 3 is a sequence diagram of an AMOLED pixel driving circuit according to present invention.

Furthermore referring to FIG. 3, the first scan control signal Scan1, the second scan control signal Scan2 and the third scan control signal Scan3 are combined with one another, and correspond to an initialization stage 1, a voltage level storage stage 2, a light emitting stage 3 one after another;

in the initialization stage 1, the third scan control signal Scan3 provides a high voltage level, and the sixth thin film transistor T6 is on, and the fourth thin film transistor T4 and the fifth thin film transistor T5 are off, and the second scan control signal Scan2 provides a low voltage level, and the third thin film transistor T3 is on, and the first scan control signal Scan1 provides a high voltage level, and the second thin film transistor T2 is off; then, the data signal Data charges the first node G and the second node N to make voltages of the first node G and the second node N equal to a voltage of the data signal Data, and the organic light emitting diode D does not emit light;

in the voltage level storage stage 2, the third scan control signal Scan3 provides a high voltage level, and the sixth thin film transistor T6 is on, and the fourth thin film transistor T4 and the fifth thin film transistor T5 are off, and the second scan control signal Scan2 provides a high voltage level, and the third thin film transistor T3 is off, and the first scan control signal Scan1 provides a low voltage level, and the second thin film transistor T2 is on; then, the voltage of the second node N is still equal to the voltage of the data signal Data, and the power supply high voltage OVDD constantly charges the first node G until a voltage difference between the source of the first thin film transistor T1 and the first node G, which is a source-gate voltage difference of the first thin film transistor T1 is equal to the threshold voltage of the first thin film transistor T1, i.e. $V_g=V_s-V_{th}$, wherein $V_s$ is a source voltage of the first thin film transistor T1, and $V_g$ is the voltage of the first node G, and $V_{th}$ is a threshold voltage of the first thin film transistor T1, and a source voltage of the first thin film transistor T1 is equal to the power supply high voltage OVDD.

In the light emitting stage 3, the third scan control signal Scan3 provides a low voltage level, and the sixth thin film transistor T6 is off, and the fourth thin film transistor T4 and the fifth thin film transistor T5 are on, and the second scan control signal Scan2 provides a high voltage level, and the third thin film transistor T3 is off, and the first scan control signal Scan1 provides a low voltage level, and the second thin film transistor T2 is off; then, the voltage of the second node N is changed to be the initialization voltage $V_{ini}$, and the voltage of the first node G is change to be $V_s-V_{th}+V_{ini}-V_{data}$, wherein $V_{data}$ is the voltage of the data signal Data, and a voltage difference between the source of the first thin film transistor T1 and the first node G, i.e. a source-gate voltage difference of the first thin film transistor T1 is changed to be $V_{data}-V_{ini}+V_{th}$, and the organic light emitting diode D emits light, and the formula of the current flowing through the organic light emitting diode as the drive thin film transistor utilizes a P type thin film transistor according to the present skill is:

$$I=K(V_{sg}-V_{th})^2;$$

wherein I is the current flowing through the organic light emitting diode D, and K is the structure parameter of the first thin film transistor T1, and $V_{sg}$ is the source-gate voltage difference of the drive thin film transistor, i.e. the first thin film transistor T1, and then, the source-gate voltage difference of the first thin film transistor T1 is $V_{data}-V_{ini}+V_{th}$, and thus $I=K(V_{sg}-V_{th})^2=K(V_{data}-V_{ini}+V_{th}-V_{th})^2=K(V_{data}-V_{ini})^2$, and as regarding the thin film transistors having the same structure, K is relatively stable, and therefore, the current flowing through the organic light emitting diode D is irrelevant with the threshold voltage of the first thin film transistor T1 for solving the issue of the unstable current flowing through the organic light emitting diode caused by the threshold voltage drift of the driving thin film transistor to achieve the uniform brightness of the organic light emitting diode and improve the display effect of the pictures. Moreover, the organic light emitting diode D does not emit light in the initialization stage 1 and the voltage level storage stage 2 to avoid the unnecessary irradiance of the organic light emitting diode D.

Please refer to FIG. 4 with FIG. 3 at the same time. The present invention further provides an AMOLED pixel driving method, comprising steps of:

step S1, providing an AMOLED pixel driving circuit utilizing the 6T1C structure as shown in the aforesaid FIG. 2, and the description of the circuit is not repeated here;

step S2, entering an initialization stage 1;

the third scan control signal Scan3 provides a high voltage level, and the sixth thin film transistor T6 is on, and the fourth thin film transistor T4 and the fifth thin film transistor T5 are off, and the second scan control signal Scan2 provides a low voltage level, and the third thin film transistor T3 is on, and the first scan control signal Scan1 provides a high voltage level, and the second thin film transistor T2 is off, and the data signal Data charges the first node G and the second node N to make voltages of the first node G and the second node N equal to a voltage of the data signal Data, and the organic light emitting diode D does not emit light;

step S3, entering a voltage level storage stage 2;

the third scan control signal Scan3 provides a high voltage level, and the sixth thin film transistor T6 is on, and the fourth thin film transistor T4 and the fifth thin film transistor T5 are off, and the second scan control signal Scan2 provides a high voltage level, and the third thin film transistor T3 is off, and the first scan control signal Scan1 provides a low voltage level, and the second thin film transistor T2 is on, and the voltage of the second node N is still equal to the voltage of the data signal Data, and the power supply high voltage OVDD constantly charges the first node G until $V_g=V_s-V_{th}$, wherein $V_s$ is a source voltage of the first thin film transistor T1, and $V_g$ is the voltage of the first node G, and $V_{th}$ is a threshold voltage of the first thin film transistor T1;

step S4, entering a light emitting stage 3;

the third scan control signal Scan3 provides a low voltage level, and the sixth thin film transistor T6 is off, and the fourth thin film transistor T4 and the fifth thin film transistor T5 are on, and the second scan control signal Scan2 provides a high voltage level, and the third thin film transistor T3 is off, and the first scan control signal Scan1 provides a low voltage level, and the second thin film transistor T2 is off, and the voltage of the second node N is changed to be the initialization voltage $V_{ini}$, and the voltage of the first node G is change to be $V_s-V_{th}+V_{ini}-V_{data}$, wherein $V_{data}$ is the voltage of the data signal Data, and a voltage between the source of the first thin film transistor T1 and the first node G, i.e. a source-gate voltage difference of the first thin film transistor T1 is changed to be $V_{data}-V_{ini}+V_{th}$, and the organic light emitting diode D emits light.

Specifically, the formula of the current flowing through the organic light emitting diode as the drive thin film transistor utilizes a P type thin film transistor according to the present skill is:

$$I=K(V_{sg}-V_{th})^2;$$

wherein I is the current flowing through the organic light emitting diode D, and K is the structure parameter of the first thin film transistor T1, and $V_{sg}$ is the source-gate voltage difference of the drive thin film transistor, i.e. the first thin film transistor T1, and then, the source-gate voltage difference of the first thin film transistor T1 is $V_{data}-V_{ini}+V_{th}$, and thus $I=K(V_{sg}-V_{th})^2=K(V_{data}-V_{ini}+V_{th}-V_{th})2=K(V_{data}-V_{ini})^2$, and as regarding the thin film transistors having the same structure, K is relatively stable, and therefore, the current flowing through the organic light emitting diode D is irrelevant with the threshold voltage of the first thin film transistor T1 for solving the issue of the unstable current flowing through the organic light emitting diode caused by the threshold voltage drift of the driving thin film transistor to achieve the uniform brightness of the organic light emitting diode and improve the display effect of the pictures.

In conclusion, the present invention provides an AMOLED pixel driving circuit, which utilizes the 6T1C structure pixel driving circuit with a specific drive timing and can effectively compensate the threshold voltage of the drive thin film transistor and can stabilize the current flowing through the organic light emitting diode to ensure the uniform brightness of the organic light emitting diode and improve the display effect of the pictures. The organic light emitting diode can emit light only in the light emitting stage to avoid the unnecessary irradiance of the organic light emitting diode to reduce the electrical power consumption. The present invention further provides an AMOLED pixel driving circuit, which can effectively compensate the threshold voltage of the drive thin film transistor and solve the issue of the unstable current flowing through the organic light emitting diode caused by the threshold voltage drift to achieve the uniform brightness of the organic light emitting diode and improve the display effect of the pictures.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An AMOLED pixel driving circuit, comprising: a first thin film transistor, a second thin film transistor, a third thin film transistor, a fourth thin film transistor, a fifth thin film transistor, a sixth thin film transistor, a capacitor and an organic light emitting diode;
   a gate of the first thin film transistor being electrically coupled to a first node, and a source receiving a power supply high voltage, and a drain being electrically coupled to a source of the fourth thin film transistor;
   a gate of the second thin film transistor receiving a first scan control signal, and a source being electrically coupled to the first node, and a drain being electrically coupled to the source of the fourth thin film transistor;
   a gate of the third thin film transistor receiving a second scan control signal, and a source being electrically coupled to a second node, and a drain being electrically coupled to the first node;
   a gate of the fourth thin film transistor receiving a third scan control signal, and a source being electrically coupled to a drain of the second thin film transistor and a drain of the first thin film transistor, and a drain being electrically coupled to an anode of the organic light emitting diode;
   a gate of the fifth thin film transistor receiving the third scan control signal, and a source being electrically coupled to the second node and a drain receiving an initialization voltage;
   a gate of the sixth thin film transistor receiving the third scan control signal, and a source receiving a data signal, and a drain being electrically coupled to the second node;
   one end of the capacitor being electrically coupled to the first node, and the other end being electrically coupled to the second node;
   a cathode of the organic light emitting diode receiving a power supply low voltage;
   the sixth thin film transistor being a N type thin film transistor, and the first thin film transistor, the second thin film transistor, the third thin film transistor, the fourth thin film transistor and the fifth thin film transistor being P type thin film transistors.

2. The AMOLED pixel driving circuit according to claim 1, wherein the first scan control signal, the second scan control signal and the third scan control signal are combined with one another, and correspond to an initialization stage, a voltage level storage stage, a light emitting stage one after another, and control the organic light emitting diode not to emit light in the initialization stage and the voltage level storage stage.

3. The AMOLED pixel driving circuit according to claim 2, wherein in the initialization stage, the third scan control signal provides a high voltage level, and the second scan control signal provides a low voltage level, and the first scan control signal provides a high voltage level;
   in the voltage level storage stage, the third scan control signal provides a high voltage level, and the second scan control signal provides a high voltage level, and the first scan control signal provides a low voltage level;
   in the light emitting stage, the third scan control signal provides a low voltage level, and the second scan control signal provides a high voltage level, and the first scan control signal provides a high voltage level.

4. The AMOLED pixel driving circuit according to claim 1, wherein all of the first scan control signal, the second scan control signal and the third scan control signal are provided by an external sequence controller.

5. The AMOLED pixel driving circuit according to claim 1, wherein all of the first thin film transistor, the second thin film transistor, the third thin film transistor, the fourth thin film transistor, the fifth thin film transistor and the sixth thin film transistor are Low Temperature Poly-silicon thin film transistors, oxide semiconductor thin film transistors or amorphous silicon thin film transistors.

6. An AMOLED pixel driving method, comprising steps of:
   step S1, providing an AMOLED pixel driving circuit;
   the AMOLED pixel driving circuit comprising: a first thin film transistor, a second thin film transistor, a third thin film transistor, a fourth thin film transistor, a fifth thin film transistor, a sixth thin film transistor, a capacitor and an organic light emitting diode;
   a gate of the first thin film transistor being electrically coupled to a first node, and a source receiving a power supply high voltage, and a drain being electrically coupled to a source of the fourth thin film transistor;

a gate of the second thin film transistor receiving a first scan control signal, and a source being electrically coupled to the first node, and a drain being electrically coupled to the source of the fourth thin film transistor;
a gate of the third thin film transistor receiving a second scan control signal, and a source being electrically coupled to a second node, and a drain being electrically coupled to the first node;
a gate of the fourth thin film transistor receiving a third scan control signal, and a source being electrically coupled to a drain of the second thin film transistor and a drain of the first thin film transistor, and a drain being electrically coupled to an anode of the organic light emitting diode;
a gate of the fifth thin film transistor receiving the third scan control signal, and a source being electrically coupled to the second node and a drain receiving an initialization voltage;
a gate of the sixth thin film transistor receiving the third scan control signal, and a source receiving a data signal, and a drain being electrically coupled to the second node;
one end of the capacitor being electrically coupled to the first node, and the other end being electrically coupled to the second node;
a cathode of the organic light emitting diode receiving a power supply low voltage;
wherein the sixth thin film transistor is a N type thin film transistor, and the first thin film transistor, the second thin film transistor, the third thin film transistor, the fourth thin film transistor and the fifth thin film transistor are P type thin film transistors;
step S2, entering an initialization stage;
the third scan control signal provides a high voltage level, and the sixth thin film transistor is on, and the fourth thin film transistor and the fifth thin film transistor are off, and the second scan control signal provides a low voltage level, and the third thin film transistor is on, and the first scan control signal provides a high voltage level, and the second thin film transistor is off, and the data signal charges the first node and the second node to make voltages of the first node and the second node equal to a voltage of the data signal, and the organic light emitting diode does not emit light;
step S3, entering a voltage level storage stage;
the third scan control signal provides a high voltage level, and the sixth thin film transistor is on, and the fourth thin film transistor and the fifth thin film transistor are off, and the second scan control signal provides a high voltage level, and the third thin film transistor is off, and the first scan control signal provides a low voltage level, and the second thin film transistor is on, and the voltage of the second node is still equal to the voltage of the data signal, and the power supply high voltage constantly charges the first node until $V_g=V_s-V_{th}$, wherein $V_s$ is a source voltage of the first thin film transistor, and $V_g$ is the voltage of the first node, and $V_{th}$ is a threshold voltage of the first thin film transistor;
step S4, entering a light emitting stage;
the third scan control signal provides a low voltage level, and the sixth thin film transistor is off, and the fourth thin film transistor and the fifth thin film transistor are on, and the second scan control signal provides a high voltage level, and the third thin film transistor is off, and the first scan control signal provides a low voltage level, and the second thin film transistor is off, and the voltage of the second node is changed to be the initialization voltage, and the voltage of the first node is change to be $V_s-V_{th}+V_{ini}-V_{data}$, wherein $V_{data}$ is the voltage of the data signal, and the organic light emitting diode emits light, and a current flowing through the organic light emitting diode is irrelevant with the threshold voltage of the first thin film transistor.

7. The AMOLED pixel driving method according to claim 6, wherein all of the first scan control signal, the second scan control signal and the third scan control signal are provided by an external sequence controller.

8. The AMOLED pixel driving circuit according to claim 6, wherein all of the first thin film transistor, the second thin film transistor, the third thin film transistor, the fourth thin film transistor, the fifth thin film transistor and the sixth thin film transistor are Low Temperature Poly-silicon thin film transistors, oxide semiconductor thin film transistors or amorphous silicon thin film transistors.

9. An AMOLED pixel driving circuit, comprising: a first thin film transistor, a second thin film transistor, a third thin film transistor, a fourth thin film transistor, a fifth thin film transistor, a sixth thin film transistor, a capacitor and an organic light emitting diode;
a gate of the first thin film transistor being electrically coupled to a first node, and a source receiving a power supply high voltage, and a drain being electrically coupled to a source of the fourth thin film transistor;
a gate of the second thin film transistor receiving a first scan control signal, and a source being electrically coupled to the first node, and a drain being electrically coupled to the source of the fourth thin film transistor;
a gate of the third thin film transistor receiving a second scan control signal, and a source being electrically coupled to a second node, and a drain being electrically coupled to the first node;
a gate of the fourth thin film transistor receiving a third scan control signal, and a source being electrically coupled to a drain of the second thin film transistor and a drain of the first thin film transistor, and a drain being electrically coupled to an anode of the organic light emitting diode;
a gate of the fifth thin film transistor receiving the third scan control signal, and a source being electrically coupled to the second node and a drain receiving an initialization voltage;
a gate of the sixth thin film transistor receiving the third scan control signal, and a source receiving a data signal, and a drain being electrically coupled to the second node;
one end of the capacitor being electrically coupled to the first node, and the other end being electrically coupled to the second node;
a cathode of the organic light emitting diode receiving a power supply low voltage;
wherein the sixth thin film transistor is a N type thin film transistor, and the first thin film transistor, the second thin film transistor, the third thin film transistor, the fourth thin film transistor and the fifth thin film transistor are P type thin film transistors;
wherein the first scan control signal, the second scan control signal and the third scan control signal are combined with one another, and correspond to an initialization stage, a voltage level storage stage, a light emitting stage one after another, and control the organic light emitting diode not to emit light in the initialization stage and the voltage level storage stage.

wherein all of the first scan control signal, the second scan control signal and the third scan control signal are provided by an external sequence controller.

10. The AMOLED pixel driving circuit according to claim 9, wherein in the initialization stage, the third scan control signal provides a high voltage level, and the second scan control signal provides a low voltage level, and the first scan control signal provides a high voltage level;

in the voltage level storage stage, the third scan control signal provides a high voltage level, and the second scan control signal provides a high voltage level, and the first scan control signal provides a low voltage level;

in the light emitting stage, the third scan control signal provides a low voltage level, and the second scan control signal provides a high voltage level, and the first scan control signal provides a high voltage level.

11. The AMOLED pixel driving circuit according to claim 9, wherein all of the first thin film transistor, the second thin film transistor, the third thin film transistor, the fourth thin film transistor, the fifth thin film transistor and the sixth thin film transistor are Low Temperature Poly-silicon thin film transistors, oxide semiconductor thin film transistors or amorphous silicon thin film transistors.

* * * * *